United States Patent
Hung et al.

(10) Patent No.: US 8,501,514 B2
(45) Date of Patent: *Aug. 6, 2013

(54) METHOD FOR MANUFACTURING LIGHT EMITTING DIODE BY ETCHING WITH ALKALINE SOLUTION

(75) Inventors: Tzu-Chien Hung, Hsinchu (TW); Chia-Hui Shen, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 11 days.

This patent is subject to a terminal disclaimer.

(21) Appl. No.: 13/233,194

(22) Filed: Sep. 15, 2011

(65) Prior Publication Data
US 2012/0223324 A1    Sep. 6, 2012

(30) Foreign Application Priority Data
Mar. 3, 2011   (CN) .......................... 2011 1 0051041

(51) Int. Cl.
*H01L 21/00*    (2006.01)
*H01L 21/302*   (2006.01)
*H01L 21/461*   (2006.01)

(52) U.S. Cl.
USPC .................. 438/43; 438/29; 438/40; 438/745

(58) Field of Classification Search
None
See application file for complete search history.

(56) References Cited

U.S. PATENT DOCUMENTS

| | | | | |
|---|---|---|---|---|
| 7,723,732 B2 * | 5/2010 | Tazima et al. | | 257/79 |
| 2009/0020781 A1 * | 1/2009 | Lai | | 257/103 |
| 2012/0104407 A1 * | 5/2012 | Hung et al. | | 257/76 |
| 2012/0235157 A1 * | 9/2012 | Hung et al. | | 257/76 |
| 2012/0267656 A1 * | 10/2012 | Kuo et al. | | 257/98 |

* cited by examiner

*Primary Examiner* — Michael Jung
(74) *Attorney, Agent, or Firm* — Altis Law Group, Inc.

(57) ABSTRACT

An LED includes a substrate, a first n-type GaN layer, a connecting layer, a second n-type GaN layer, a light emitting layer, and a p-type GaN layer. The first n-type GaN layer, the connecting layer, and the second n-type GaN layer are formed on the substrate in sequence. The connecting layer is etchable by alkaline solution, and a bottom surface of the second n-type GaN layer facing towards the connecting layer has a roughed exposed portion. The GaN on the bottom surface of the second n-type GaN layer is N-face GaN. A top surface of the second n-type GaN layer facing away from the connecting layer includes a first area and a second area. The light emitting layer and the p-type GaN layer are formed on the first area of the top surface of the second n-type GaN layer in sequence.

12 Claims, 10 Drawing Sheets

METHOD FOR MANUFACTURING LIGHT EMITTING DIODE BY ETCHING WITH ALKALINE SOLUTION

BACKGROUND

1. Technical Field

The present disclosure relates to semiconductor devices and, particularly, to a light emitting diode and a method for manufacturing the light emitting diode.

2. Description of Related Art

Light emitting diodes (LEDs) have many beneficial characteristics, including low electrical power consumption, low heat generation, long lifetime, small volume, good impact resistance, fast response and excellent stability. These characteristics have enabled the LEDs to be used as a light source in electrical appliances and electronic devices.

In general, the light output of an LED depends on the quantum efficiency of the active layer and the light extraction efficiency. As the light extraction efficiency increases, the light output of the LED is enhanced. In order to improve the light extraction efficiency, efforts are made to overcome the significant photon loss resulting from total reflection inside the LED after emission from the active layer.

There are several methods for increasing the light extraction efficiency of the LED. A typical method for increasing the light extraction efficiency of the LED is to roughen the surface of the LED by etching the surface of the LED. However, it is difficult to roughen the surface of the conventional LED, and the etching process usually requires several hours; as a result, the efficiency of manufacturing the LED is decreased.

What is needed is an LED and a method for manufacturing the LED which can ameliorate the problem of the prior art.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Embodiments of the present disclosure will now be described in detail below, with reference to the accompanying drawing.

Figure 1:
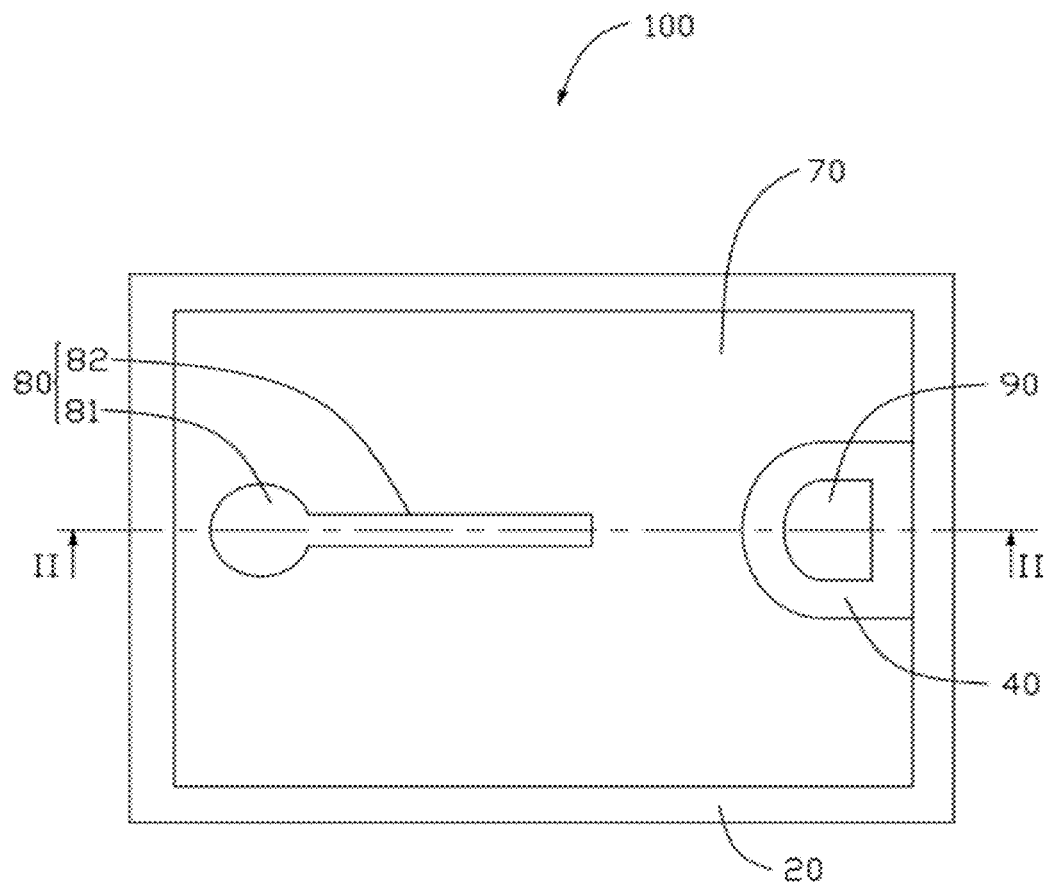
FIG. 1 is a top plan view of an LED according to an exemplary embodiment.
Figure 2:
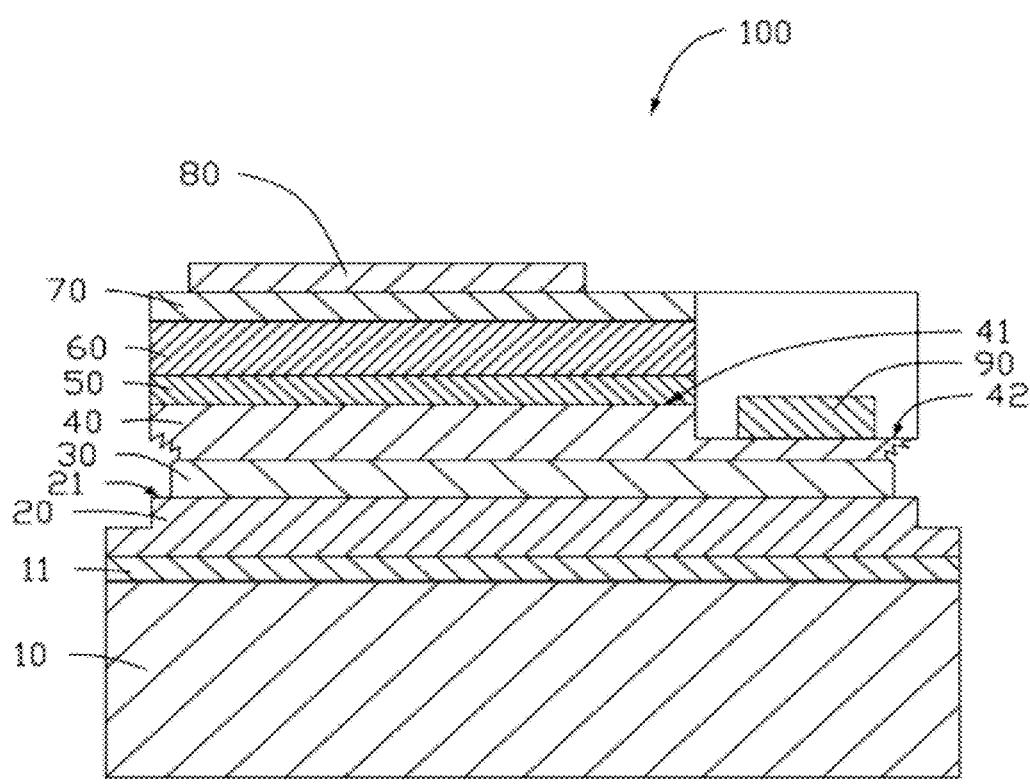
FIG. 2 is a cross sectional view of the LED taken along line II-II of FIG. 1.

Referring to FIG. 1 and FIG. 2, an LED 100 according to an exemplary embodiment is shown. The LED 100 includes a substrate 10, a first n-type GaN layer 20, a connecting layer 30, a second n-type GaN layer 40, a light emitting layer 50, a p-type GaN layer 60, a transparent conductive layer 70, a p-type electrode 80, and an n-type electrode 90.

The substrate 10 can be made of a material selected from a group consisting of Si, SiC, and sapphire, etc. In the present embodiment, the substrate 10 is made of sapphire.

Figure 3:
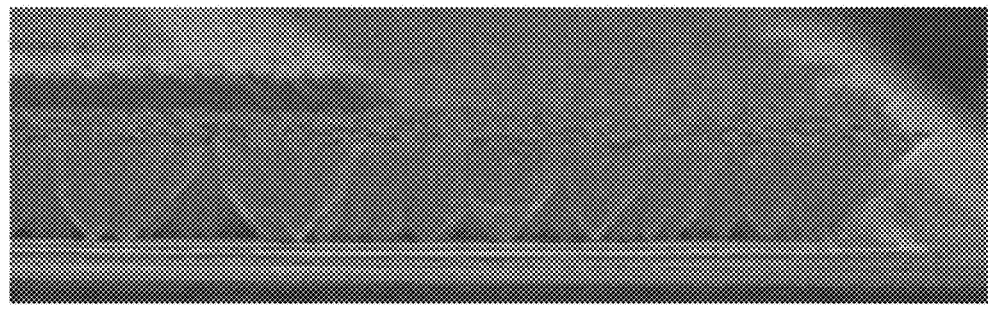
FIG. 3 is a photo of an N-face GaN etched by alkaline solution.

The first n-type GaN layer 20 is formed on the substrate 10. In order to improve the quality of the first n-type GaN layer 20, a buffer layer 11 can be formed on the substrate 10 before forming the first n-type GaN layer 20. The first n-type GaN layer 20 has a first surface 21 facing away from the substrate 10. The GaN on the first surface 21 of the first n-type GaN layer 20 is Ga-face GaN. The Ga-face GaN has lattices thereof with Ga atoms on surfaces of the lattices. N-face GaN has lattices thereof with N atoms on surfaces of the lattices. The N-face GaN can be etched by alkaline solution under 100 degree centigrade to form a roughened surface with hexagonal pyramid structures (see FIG. 3), but the Ga-face GaN nearly does not react with alkaline solution under 100 degree centigrade.

The connecting layer 30 and the second n-type GaN layer 40 are formed on the first surface 21 of the first n-type GaN layer 20 in sequence. The connecting layer 30 can be etched easily by alkaline solution under 100 degrees centigrade. The area of the connecting layer 30 is smaller than that of the second n-type GaN layer 40; thus, a bottom surface of the second n-type GaN layer 40 facing towards the connecting layer 30 has an exposed portion. The connecting layer 30 can be made of a material selected from a group consisting of AlN, $SiO_2$, and silicon nitride. In the present embodiment, the connecting layer 30 is made of AlN. Preferably, a thickness of the connecting layer 30 is in a range from 5 nm to 1000 nm.

The GaN on the bottom surface of the second n-type GaN layer 40 is the N-face GaN. The exposed portion of the bottom surface of the second n-type GaN layer 40 is roughed to improve the light extraction efficiency of the LED 100. The second n-type GaN layer 40 has a top surface facing away from the connecting layer 30, wherein the top surface includes a first area 41 and a second area 42. The light emitting layer 50, the p-type GaN layer 60, the transparent conductive layer 70, and the p-type electrode 80 are formed on the first area 41 in sequence. The n-type electrode 90 is formed on the second area 42.

The transparent conductive layer 70 can be made of Ni—Au alloy or indium tin oxide (ITO). In the present embodiment, the transparent conductive layer 70 is made of ITO.

In the present embodiment, the p-type electrode 80 includes a round electrically connecting portion 81 and a linear electrically spreading portion 82. The electrically connecting portion 81 and the n-type electrode 90 are located at two opposite ends of the LED 100 respectively. The electrically spreading portion 82 extends from the electrically connecting portion 81 towards the n-type electrode 90.

Referring to FIG. 4 to FIG. 9, a first method for manufacturing the LED 100 according to the exemplary embodiment is shown. The first method includes following steps.

Figure 4:
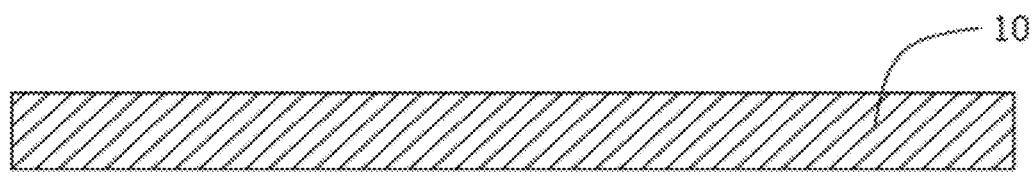
FIGS. 4-9 are views showing different steps of a process of a first method for manufacturing the LED of FIG. 2.

Referring to FIG. 4, the first step is to provide the substrate 10. The substrate 10 can be made of a material selected from a group consisting of Si, SiC, and sapphire, etc.

Figure 5:
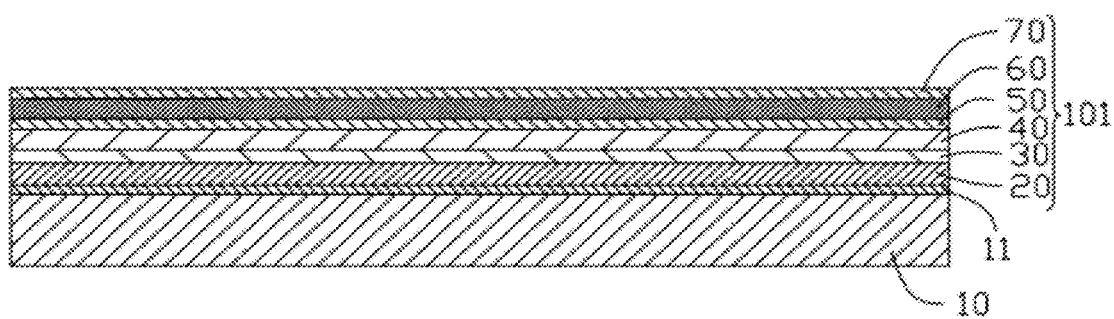

Referring to FIG. 5, the second step is to form the first n-type GaN layer 20, the connecting layer 30, the second n-type GaN layer 40, the light emitting layer 50, the p-type GaN layer 60, and the transparent conductive layer 70 on the substrate 10 in sequence. The first n-type GaN layer 20, the connecting layer 30, the second n-type GaN layer 40, the light emitting layer 50, the p-type GaN layer 60, and the transparent conductive layer 70 cooperatively form a semiconductor layer 101. In order to improve the quality of the first n-type GaN layer 20, a buffer layer 11 can be formed on the substrate 10 before forming the first n-type GaN layer 20. The GaN on the first surface 21 of the first n-type GaN layer 20 is Ga-face GaN, so that the first n-type GaN layer 20 would not be etched by alkaline solution. The connecting layer 30 can be etched easily by alkaline solution under 100 degree centigrade. The thickness of the connecting layer 30 is in a range from 5 nm to 1000 nm. The GaN on the bottom surface of the second n-type GaN layer 40 is N-face GaN which can be etched easily by alkaline solution.

Figure 6:
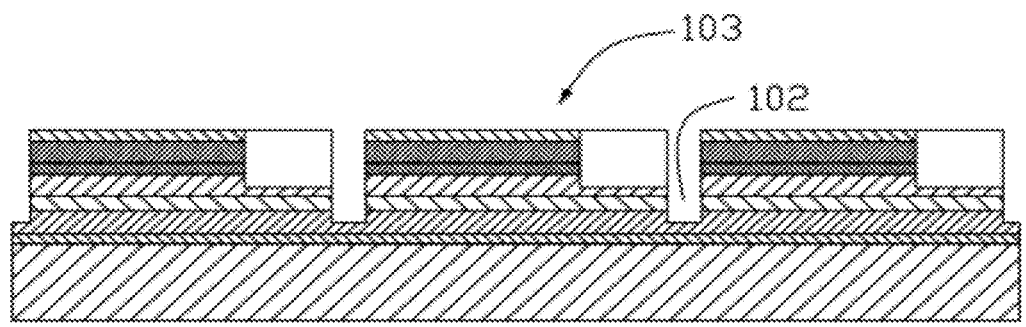

Referring to FIG. 6, the third step is to form a number of cutting channels 102 on the semiconductor layer 101 to divide the semiconductor layer 101 into a number of light emitting units 103, and to etch each light emitting unit 103 to expose a portion of the second n-type GaN layer 40 of each light emitting unit 103. The cutting channel 102 runs through the transparent conductive layer 70, the p-type GaN layer 60, the light emitting layer 50, the second n-type GaN layer 40, the connecting layer 30 to expose a portion of the first n-type GaN layer 20. It is understood, in other embodiments, the cutting channel 102 can not run through the connecting layer 30, but only expose the connecting layer 30. The cutting channels 102 can be formed using inductively coupled plasma technology.

Figure 7:
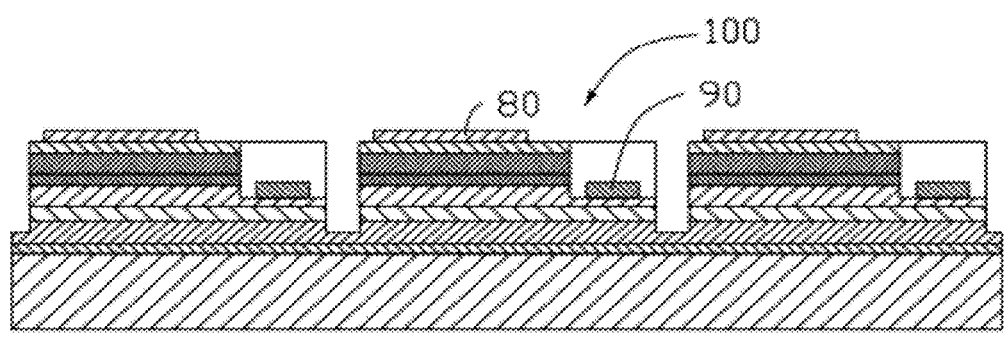

Referring to FIG. 7, the fourth step is to form the p-type electrode 80 on the transparent conductive layer 70 of each light emitting unit 103, and to form the n-type electrode 90 on the exposed portion of the second n-type GaN layer 40 of each light emitting unit 103.

Figure 8:
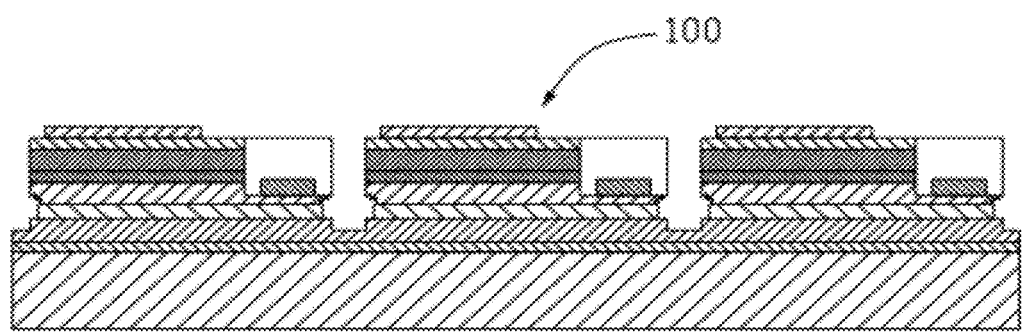

Referring to FIG. 8, the fifth step is to use alkaline solution to etch away opposite lateral ends of the connecting layer 30 of each LED unit 103 to expose opposite end portions of a bottom surface of the second n-type GaN layer 40. Then the alkaline solution is used to etch and roughen the exposed opposite end portions of the bottom surface of the second n-type GaN layer 40 of each LED unit 103. In order to accelerate the etching speed, the alkaline solution can be strong alkaline solution, such as KOH solution, NaOH solution etc. For example, the connecting layer 30 and the second n-type GaN layer 40 can be etched by KOH solution with a temperature of 85 degree centigrade for 30 to 60 minutes.

Figure 9:
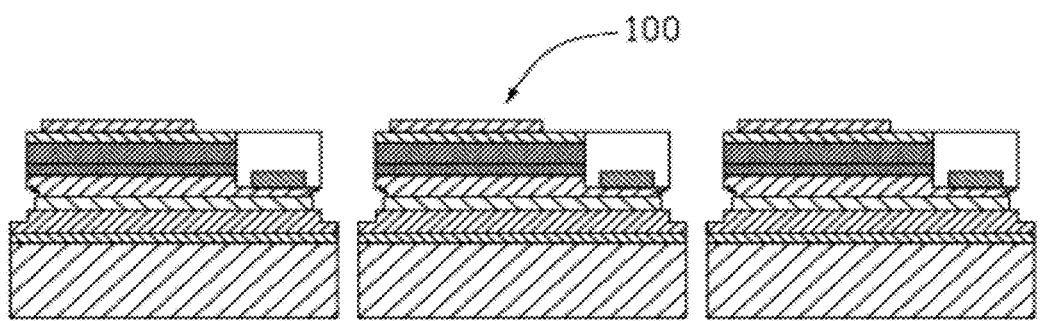

Referring to FIG. 9, the sixth step is to separate the LED units 103 along the cutting channels 102 to obtain a number of LEDs 100.

It is understood, in other embodiments, the LED 100 would not include the transparent conductive layer 70; thus, the p-type electrode 80 can be directly formed on the p-type GaN layer 60. Furthermore, the fourth step can also be arranged after the fifth step.

Figure 10:
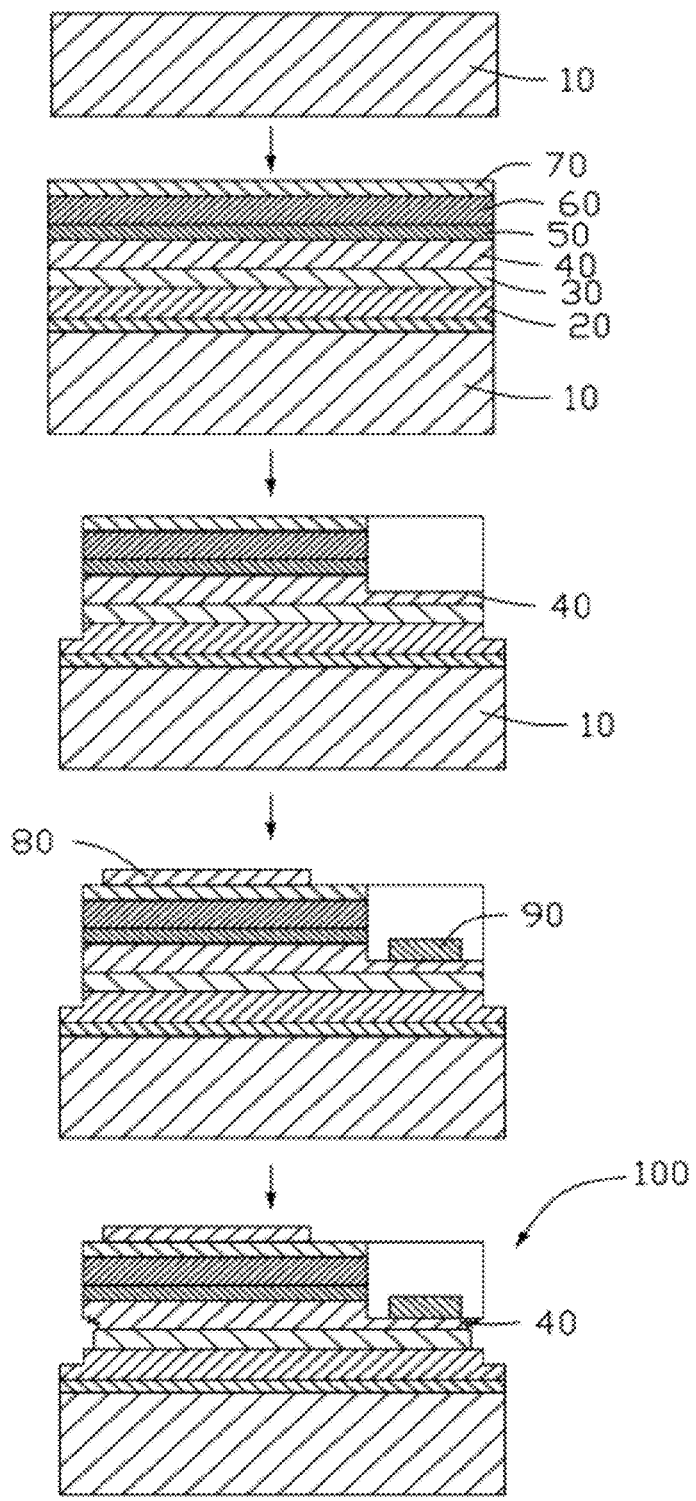
FIG. 10 shows steps of a process of a second method of manufacturing the LED of FIG. 2.

Referring to FIG. 10, a second method for manufacturing the LED 100 according to the exemplary embodiment is shown. The second method is similar to the first method; however only one LED 100 is obtained. The second method includes following steps: providing the substrate 10; forming the first n-type GaN layer 20, the connecting layer 30, the second n-type GaN layer 40, the light emitting layer 50, the p-type GaN layer 60, and the transparent conductive layer 70 on the substrate 10 in sequence; etching the transparent conductive layer 70, the p-type GaN layer 60, and the light emitting layer 50 to expose a portion of the second n-type GaN layer 40; forming the p-type electrode 80 on the transparent conductive layer 70 and the n-type electrode 90 on the exposed portion of the second n-type GaN layer 40; and using alkaline solution to etch away two opposite lateral ends of the connecting layer 30 thereby exposing two opposite end portions of a bottom surface of the second n-type GaN layer 40; and etching and roughing the exposed two opposite end portions of the bottom surface of the second n-type GaN layer 40 by using the alkaline solution.

While certain embodiments have been described and exemplified above, various other embodiments will be apparent to those skilled in the art from the foregoing disclosure. The disclosure is not limited to the particular embodiments described and exemplified, and the embodiments are capable of considerable variation and modification without departure from the scope and spirit of the appended claims.

What is claimed is:

1. A method for manufacturing an LED comprising:
   providing a substrate;
   forming a first n-type GaN layer, a connecting layer, a second n-type GaN layer, a light emitting layer, and a p-type GaN layer on the substrate in sequence, the connecting layer being etchable by alkaline solution, a GaN on a bottom surface of the second n-type GaN layer facing towards the connecting layer being an N-face GaN; and
   etching away a portion of the connecting layer by using alkaline solution to expose a portion of the bottom surface of the second n-type GaN layer, and etching the exposed portion of the bottom surface of the second n-type GaN layer by using the alkaline solution to roughen the exposed portion of the bottom surface of the second n-type GaN layer.

2. The method as claimed in claim 1, further comprising steps of: etching the p-type GaN layer, and the light emitting layer to expose a portion of a top surface of the second n-type GaN layer facing away from the connecting layer; and forming a p-type electrode on the p-type GaN layer and an n-type electrode on the exposed portion of the top surface of the second n-type GaN layer.

3. The method as claimed in claim 2, wherein the p-type electrode comprises a round electrically connecting portion and a linear electrically spreading portion, the electrically connecting portion and the n-type electrode are located at two opposite ends of the LED respectively, and the electrically spreading portion extends from the electrically connecting portion towards the n-type electrode.

4. The method as claimed in claim 2, further comprising a step of: forming a transparent conductive layer on the p-type GaN layer before forming the p-type electrode, wherein the p-type electrode is formed on the transparent conductive layer.

5. The method as claimed in claim 1, wherein the first n-type GaN layer has a first surface facing away from the substrate, and the GaN on the first surface of the first n-type GaN layer is Ga-face GaN.

6. The method as claimed in claim 1, wherein the connecting layer is made of a material selected from a group consisting of AlN, $SiO_2$, and silicon nitride.

7. The method as claimed in claim 1, wherein a thickness of the connecting layer is in a range from 5 nm to 1000 nm.

8. The method as claimed in claim 1, wherein the alkaline solution is KOH solution or NaOH solution.

9. A method for manufacturing an LED comprising:
   providing a substrate;
   forming a first n-type GaN layer, a connecting layer, a second n-type GaN layer, a light emitting layer, and a p-type GaN layer on the substrate in sequence, the first n-type GaN layer, the connecting layer, the second n-type GaN layer, the light emitting layer, and the p-type GaN layer cooperatively form a semiconductor layer, the connecting layer being etchable by alkaline solution, a GaN on a bottom surface of the second n-type GaN layer facing towards the connecting layer being an N-face GaN;

forming a plurality of cutting channels on the semiconductor layer to divide the semiconductor layer into a plurality of light emitting units, the cutting channel running through the p-type GaN layer, the light emitting layer, and the second n-type GaN layer to expose a portion of the connecting layer; and etching away a portion of the connecting layer of each light emitting unit by using alkaline solution to expose a portion of the bottom surface of the second n-type GaN layer, and etching the exposed portion of the bottom surface of the second n-type GaN layer by using the alkaline solution to roughen the exposed portion of the bottom surface of the second n-type GaN layer.

10. The method as claimed in claim 9, further comprising steps of: etching the p-type GaN layer and the light emitting layer of each light emitting unit to expose a portion of a top surface of the second n-type GaN layer facing away from the connecting layer; and forming a p-type electrode on the p-type GaN layer of each light emitting unit and an n-type electrode on the exposed portion of the top surface of the second n-type GaN layer of each light emitting unit.

11. The method as claimed in claim 9, further comprising a step of: separating the plurality of light emitting units wherein each light emitting unit forms a corresponding LED.

12. The method as claimed in claim 9, wherein the cutting channel further runs through the connecting layer.

* * * * *